US007795859B1

(12) United States Patent
Lynch et al.

(10) Patent No.: US 7,795,859 B1
(45) Date of Patent: Sep. 14, 2010

(54) LOW COST MILLIMETER WAVE IMAGER

(75) Inventors: Jonathan James Lynch, Oxnard, CA (US); James H. Schaffner, Chatsworth, CA (US); Daniel Frederic Sievenpiper, Los Angeles, CA (US); Debabani Choudhury, Thousand Oaks, CA (US); Joseph Colburn, Malibu, CA (US); Joel N. Schulman, Malibu, CA (US); Harris P. Moyer, Los Angeles, CA (US); Andrew T. Hunter, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/503,690

(22) Filed: Jul. 15, 2009

Related U.S. Application Data

(62) Division of application No. 11/303,642, filed on Dec. 16, 2005, now Pat. No. 7,583,074.

(51) Int. Cl.
  *G01R 19/22* (2006.01)
(52) U.S. Cl. .......................... 324/120; 324/95; 324/637
(58) Field of Classification Search .................. 324/120
  See application file for complete search history.

(56) References Cited

U.S. PATENT DOCUMENTS

| 3,262,029 | A | 7/1966 | Eng |
| 3,668,554 | A | 6/1972 | Dupre |
| 3,670,328 | A | 6/1972 | Mardon et al. |
| 3,824,593 | A | 7/1974 | Baird |
| 3,882,396 | A | 5/1975 | Schneider |
| 4,789,840 | A | 12/1988 | Albin |
| 5,233,464 | A | 8/1993 | Costich |
| 5,237,334 | A | 8/1993 | Waters |
| 5,365,237 | A | 11/1994 | Johnson et al. |
| 5,438,336 | A | * | 8/1995 | Lee et al. ..................... 342/174 |
| 5,760,397 | A | 6/1998 | Huguenin et al. |
| 5,841,288 | A | * | 11/1998 | Meaney et al. .............. 324/639 |

(Continued)

OTHER PUBLICATIONS

A. Luukanen, et al., "Active millimeter-wave video rate imaging with a staring 120-element microbolometer array," *Radar Sensor Technology VIII and Passive Millimeter-Wave Imaging Technology VII*, edited by Robert Trebits, et al., 2004, pp. 195-201, Proceedings of SPIE vol. 5410, SPIE, Bellingham, Washington.

(Continued)

*Primary Examiner*—Thomas F. Valone
(74) *Attorney, Agent, or Firm*—Christie, Parker & Hale

(57) ABSTRACT

Low cost millimeter wave imagers using two-dimensional focal plane arrays based on backward tunneling diode (BTD) detectors. Two-dimensional focal arrays of BTD detectors are used as focal plane arrays in imagers. High responsivity of BTD detectors near zero bias results in low noise detectors that alleviate the need for expensive and heat generating low noise amplifiers or Dicke switches in the imager. BTD detectors are installed on a printed circuit board using flip chip packaging technology and horn antennas direct the waves toward the flip chip including the BTD detectors. The assembly of the horn antennas, flip chips, printed circuit board substrate, and interconnects together work as an imaging sensor. Corrugated surfaces of the components prevent re-radiation of the incident waves.

13 Claims, 10 Drawing Sheets

U.S. PATENT DOCUMENTS

| | | | |
|---|---|---|---|
| 6,049,308 | A | 4/2000 | Hietala et al. |
| 6,049,313 | A | 4/2000 | Sawada et al. |
| 6,417,502 | B1 | 7/2002 | Stoner et al. |
| 6,507,043 | B1 | 1/2003 | Chow et al. |
| 6,635,907 | B1 | 10/2003 | Nguyen et al. |
| 6,828,556 | B2 | 12/2004 | Pobanz et al. |
| 6,841,768 | B2 | 1/2005 | Moon et al. |
| 6,845,184 | B1 | 1/2005 | Yoshimura et al. |
| 7,583,074 | B1 * | 9/2009 | Lynch et al. ............ 324/120 |
| 2002/0149530 | A1 | 10/2002 | Ballantine et al. |

OTHER PUBLICATIONS

Gert De Lange, et al., "Development of a 3×3 Micromachined Millimeter Wave SIS Imaging Array," *IEEE Transactions on Applied Superconductivity*, Jun. 1997, pp. 3593-3596, vol. 7, No. 2, IEEE.

Peter H. Siegel, "Terahertz Technology," *IEEE Transactions on Microwave Theory and Techniques*, Mar. 2002, pp. 910-928, vol. 50, No. 3, IEEE.

\* cited by examiner

LOW COST MILLIMETER WAVE IMAGER

CROSS-REFERENCE TO RELATED APPLICATION(S)

This application is a divisional of U.S. application Ser. No. 11/303,642, filed Dec. 16, 2005, now U.S. Pat. No. 7,583,074 the entire disclosure of which is hereby incorporated by reference herein.

BACKGROUND OF THE INVENTION

This invention relates to the field of millimeter wave imaging systems and, more particularly, to millimeter wave imaging systems using two dimensional focal plane sensor arrays.

Millimeter waves are another term for radio waves sent at higher frequencies. Millimeter waves are in the region of the light spectrum between 30 GHz and 300 GHz.

In the field of imaging, active radar at longer wavelengths and infrared and optical systems at shorter wavelengths are more mature technologies. Passive millimeter wave sensing is a newer technology taking advantage of the fact that millimeter waves can penetrate inclement weather and opaque solids. Work on passive millimeter wave sensing expanded with the use of microwave and millimeter wave integrated circuit (MMIC) technology that allows sensing in this region using small integrated chips. Scanners and imagers can be used for sensing at 35, 94, 140, and 220 GHz.

Certain parameters are used to determine sensitivity levels of an imaging sensor. For example, Noise Equivalent Power (NEP) is the minimum detectable power per square root of the bandwidth and Noise Equivalent Delta Temperature (NEDT) refers to the change in temperature that yields a signal-to-noise ratio of unity in a thermal imaging system.

Millimeter wave imagers have been under development for the last couple of decades. Millimeter wave imagers are useful for a number of functions, including concealed weapons detection, for example, for airport security, battlefield imaging through smoke and dust, imaging through visually opaque objects like walls, biohazard detection, and vehicular driving and landing aids. Given the potential for high volume civilian use, for example in airport security and as vehicle driving aid, there is a need for effective millimeter wave imagers.

In the field of millimeter wave imaging systems, two-dimensional sensor arrays can be used instead of a film when placed in the focal plane of a camera lens. The two-dimensional sensor arrays are capable of detecting the incoming radiation in shades of grey based on the intensity of the incident rays. These focal plane arrays have been used to detect thermal radiation which is normally quite low. An antenna detects the radiation and the detected radiation is amplified. In an exemplary 100×100 array of sensors, the same large number of amplifier chips are used, the incident radiation being detected after amplification.

However, a number of characteristics have resulted in high sensor cost. For example, many RF detectors have required cooling. See Development of a 3×3 Micromachined Millimeter Wave SIS Imaging Array, Lange, et, al., IEEE Trans. on Applied Superconductivity, vol 7, No, 2. June 1997. Other detectors do not provide the required responsivity. See Active Millimeter-wave Video Rate Imaging With a Staring 120-element Microbolometer Array, Arttu Luukanen, Aaron J. Miller, and Erich N. Grossman, Proc. SPIE Int. Soc. Opt. Eng. 5410, 195 (2004). Yet, other sensors, for example those including Schottky diodes, do not provide low noise and their noise is proportional to their required bias current. See Terahertz Technology, P. Siegel, IEEE Trans. Microwave Theory and Techniques, Vol. 50, No. 3, March 2002. Finally, most sensors have been difficult to manufacture, for example Ge diodes, or have exhibited strong temperature dependence.

These limitations have resulted in the use of radio frequency (RF) components, such as RF low noise amplifiers (LNAs) and RF Dicke switches, in order to achieve acceptable performance levels. RF LNA and RF Dicke switch components, however, are expensive and full two dimensional focal plane arrays that could contain thousands of pixels have been extraordinarily expensive. LNA elements also generate excessive heat such that using a large array of these elements close to one another becomes impracticable.

To help mitigate the high costs of two dimensional focal plane sensor arrays, some millimeter wave imagers are implemented in a scanning mode so that only a single element, or at most a single row of elements, is needed and the scene is produced through scanning. U.S. Pat. No. 6,417,502 to Stoner presents one example of millimeter wave scanning imaging systems. However, this method severely limits the acquisition time of the imager and limits its use for many applications. Other methods, such as using antennas having beam directions that are a function of frequency, have also been implemented that require only a single row of RF LNAs. U.S. Pat. No. 5,365,237 to Johnson presents an example of this method of imaging.

The one-dimensional image acquisition methods provide savings in the cost of LNA units but increase the time needed for producing a full two-dimensional image.

Therefore, a need exists for millimeter wave imagers that include two-dimensional focal arrays at a reasonable cost, are capable of delivering useful performance at room temperature without requiring RF LNAs and RF Dicke switches, and have high responsivity with very low added noise. Embodiments of the present invention meet such a need.

SUMMARY OF THE INVENTION

In accordance with the present invention, a low cost, room temperature, millimeter wave imaging sensor is provided that is capable of producing useful sensitivity levels without expensive RF electronics, such as LNAs or Dicke switches.

In embodiments of the present invention, zero-bias backward tunnel diode (BTD) detectors are combined with a highly manufacturable array of antennas to produce a low cost, yet sensitive, focal plane array, typically used in conjunction with an image-forming objective lens. The outputs of the BTD detectors are input to low frequency LNAs for amplification and are subsequently digitized using analog to digital converters. The digitized values are input to software that are used to form images.

In an embodiment, calibration is performed following detection using low cost, low frequency Dicke switches.

In an embodiment, millimeter waves in the range near 94 GHz are used.

In an embodiment, useful sensitivity levels of for example, NEP<1 pW/$\sqrt{Hz}$ and NEDT<4degK are obtained.

In an embodiment, the LNAs operate in a range near 10 KHz.

In an embodiment, BTD detectors are used in conjunction with a low cost array of antennas.

One embodiment of the present invention presents a focal plane array detector. The focal plane array detector includes a printed circuit board that has an input side and an output side, an array of backward tunneling diodes located on monolithic microwave integrated circuits, readout circuitry or electrical connections for readout circuitry located on the output side, and a plurality of horn antennas coupled to the input side. The monolithic microwave integrated circuits are assembled onto the input side. Each horn antenna is associated with a respective backward tunneling diode and directs incident waves toward the corresponding backward tunneling diode.

Another embodiment of the present invention presents a millimeter-wave imaging sensor. The millimeter-wave imaging sensor includes a focal plane array detector and an objective lens. The objective lens is located at a focal distance of the objective lens away from the focal plane array. For objects that are closer to the lens, the focal plane array may be moved to the location of the focus of the lens for the object being imaged. The focal plane array detector includes backward tunneling diodes.

Another embodiment of the present invention presents a wave detector module. The wave detector module includes a flip chip, a backward tunneling diode wave detector located on the flip chip, readout electronics or electrical connections for readout electronics coupled to the flip chip, and a horn antenna coupled to the flip chip.

Another embodiment of the present invention presents an RF printed circuit board. The RF printed circuit board includes a substrate having a thickness of approximately one quarter wavelength of a millimeter wave, a first metal pattern on a first side of the substrate, the metal pattern including bonding pads, a second metal pattern on a second side of the substrate, and a flip chip including backward tunneling diode detectors bonded to bonding pads on the substrate. The second side is opposite the first side and the second metal pattern routes a signal to connections located on the second side for readout electronics or to readout electronics located on the second side.

Another embodiment of the present invention presents a method for detecting low power waves prior to amplification. The method includes receiving wave energy, directing the wave energy toward a backward tunneling diode detector, and detecting the wave energy by the backward tunneling diode detector. The backward tunneling diode detector operates near zero bias voltage.

Another embodiment of the present invention presents an RF printed circuit board. The printed circuit board includes a substrate having a thickness of one quarter wavelength of a millimeter wave. A first metal pattern is on a first side of the substrate, and the first metal pattern includes bonding pads. A second metal pattern including electrical connections for readout electronics is on a second side of the substrate, and the second side faces oppositely away from the first side. A plurality of vias through the substrate are provided for routing a signal from the first side to the electrical connections for readout electronics located on the second side. The RF printed circuit board further includes a flip chip comprising backward tunneling diode detectors. The flip chip is bonded to the bonding pads on the first side of the substrate.

Another embodiment of the present invention provides a printed circuit board for detecting RF wave energy. The printed circuit board includes means for detecting wave energy on a first side of a printed circuit board, means for receiving and directing the wave energy radiatively toward the means for detecting wave energy without an intervening active component, and means for providing the detected wave energy to readout circuitry on a second side of the printed circuit board, the second side facing oppositely away from the first side.

DETAILED DESCRIPTION

In accordance with the present invention detectors based upon a BTD as taught in U.S. Pat. No. 6,635,907, the entire content of which is incorporated herein by reference, are integrated with a low noise antenna array and readout electronics, resulting in a low cost imager.

A BTD is a high-speed semiconductor device that exhibits an interband tunneling characteristic. Two semiconductor regions that have different compositions from one another are separated by a thin interface layer. The two semiconductor regions have energy bands shifted in opposite directions and the interface layer is thin in order to allow for electron transfer through tunneling. The BTD typically includes a heterostructure of a first layer of InAs and a second layer of GaSb or InGaSb with an interface layer of an aluminum antimonide compound. The presence of aluminum antimonide compound in the interface enhances the highly nonlinear current-voltage (I-V) curve near zero bias.

The band gap engineering of the BTD results in high nonlinearity in its current versus voltage characteristics right at 0V. This nonlinearity at 0V results in high responsivity at 0V. High responsivity yield a sensitive detector. Having the high nonlinearity at 0V allows the use of the BTD without having to apply a DC bias that generates a significant amount of noise. The nonlinearity characteristics of the BTD, therefore, results in a low noise sensor whose result is usable without prior RF amplification.

Sensors based on the BTD can provide high responsivity with very low added noise. As a result, using a BTD in a millimeter wave imager can obtain useful performance from a room temperature millimeter wave imager that does not contain RF LNAs and RF Dicke switches.

The elimination of RF LNAs may reduce the sensitivity. However, this reduction in sensitivity is regained due to the ability to incorporate large numbers of pixels in a two dimensional array without generating heat.

Figure 1:
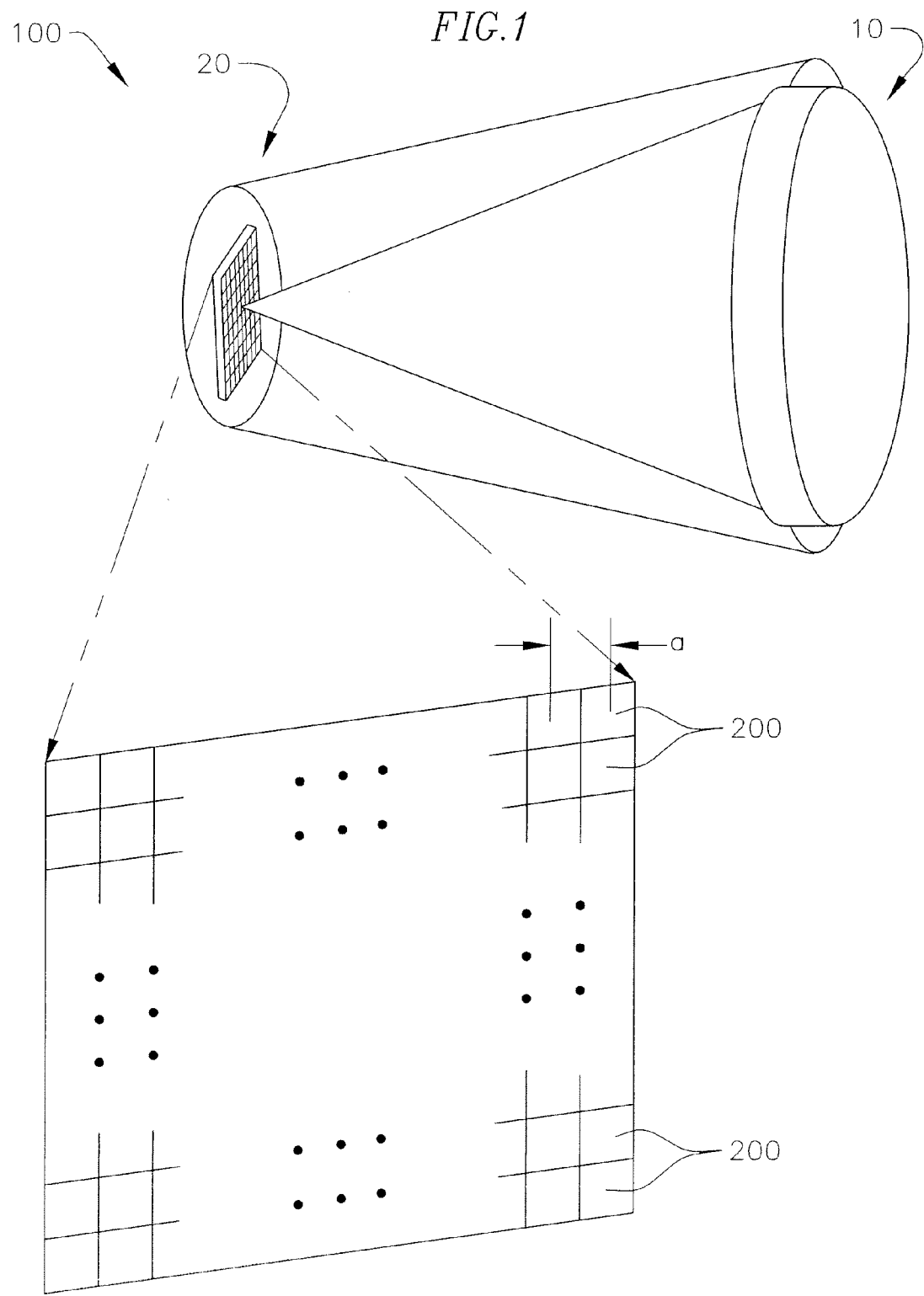
FIG. 1 shows a focal plane array imager.

FIG. 1 shows a focal plane array imager 100. The focal plane array imager 100 includes an objective lens 10 that forms an image onto a focal plane array 20. The focal plane array 20 includes an array of pixels 200 arranged in a two-dimensional matrix.

The lens 10 may be a piano-convex lens made of a suitable dielectric material to minimize loss at millimeter wave frequencies. An example of this type of material is Rexolite®. The lens 10 may or may not include grooves for antireflection.

Figure 2:
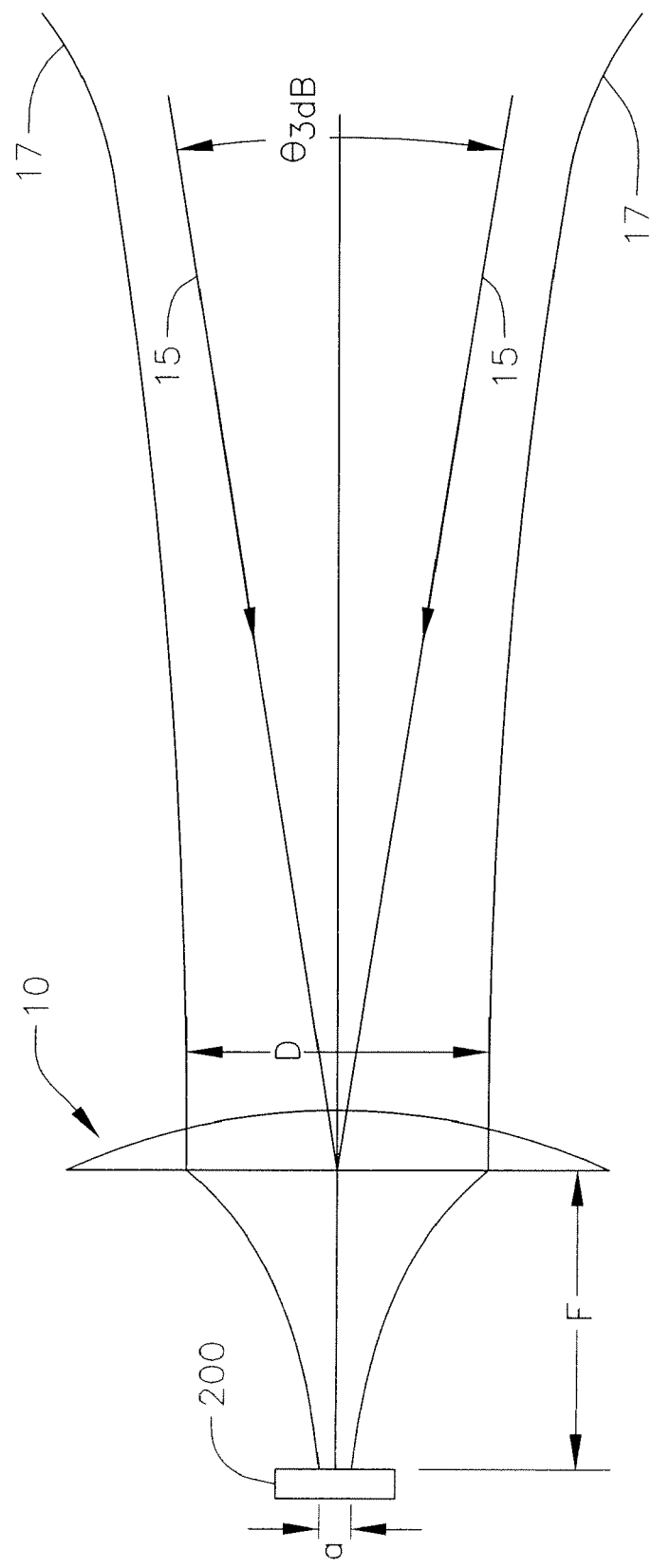
FIG. 2 shows imaging optics of the focal plane array imager.

FIG. 2 shows imaging optics of the focal plane array imager 100. The 3 dB beam width θ3 dB of beams 15 arriving at the pixel 200 on the focal plane array 20 of FIG. 1 is shown in FIG. 2. The angular resolution Δθ of the imager 100 is defined as difference between the beam angle of adjacent pixels 200. The angular resolution Δθ is determined by the ratio of the pixel separation a to the focal length of the lens F as Δθ=a/F.

Focal length F or focal distance of a lens is the distance from the lens 10 to the focal plane 20 of the lens 10 where a width of a refracted group of incoming parallel rays 17 is at its narrowest or where a group of parallel rays 17 are focused by the lens 10.

Choosing the ratio a/F also determines other properties of the imager 100. For example, the illumination spot size D on the lens 10 due to the feed from the horn of incoming rays 17, which can be taken as the lens diameter, is D=(4Fλ)/(Πa). The illumination spot size D determines the full 3 dB beam width θ3 dB of the lens that is calculated as θ3 dB=2.44λ/D≈2(a/F), where λ is the wavelength of the radiated rays 15 used for imaging.

In practice, lens 10 produces a limited focal plane over which quality focusing is achieved. The focal plane of a lens is primarily determined by the Fresnel number of the lens, which is the ratio of the focal length to the diameter, Fresnel#=F/D.

Fresnel numbers are typically chosen in the range 2-3, which determines the pixel separation a according to a=(4/Π)(F/D)λ. Pixel separation a or pixel spacing cannot be made smaller than λ/2, that is the diffraction limit. Pixel spacing a is typically chosen larger than this limit to accommodate the desired Fresnel number.

The field of view of the imager is determined by the angular resolution Δθ times the number of pixels 200 along a row or a column. Thus, the diameter of the lens D is determined by trading off image quality, physical array size, and field of view. A reflector may be used instead of a lens. A parabolic reflector provides focusing similar to a lens, but upon reflection rather than transmission. If a reflector is used, it is common to utilize an offset-fed reflector to avoid aperture blockage by the imaging sensor, because this sensor must sit in front of the reflector. Reflectors introduce less loss than lenses because the waves need not travel through an material. In short, using a lens avoids aperture blockage while a reflector is more efficient.

Figure 3:
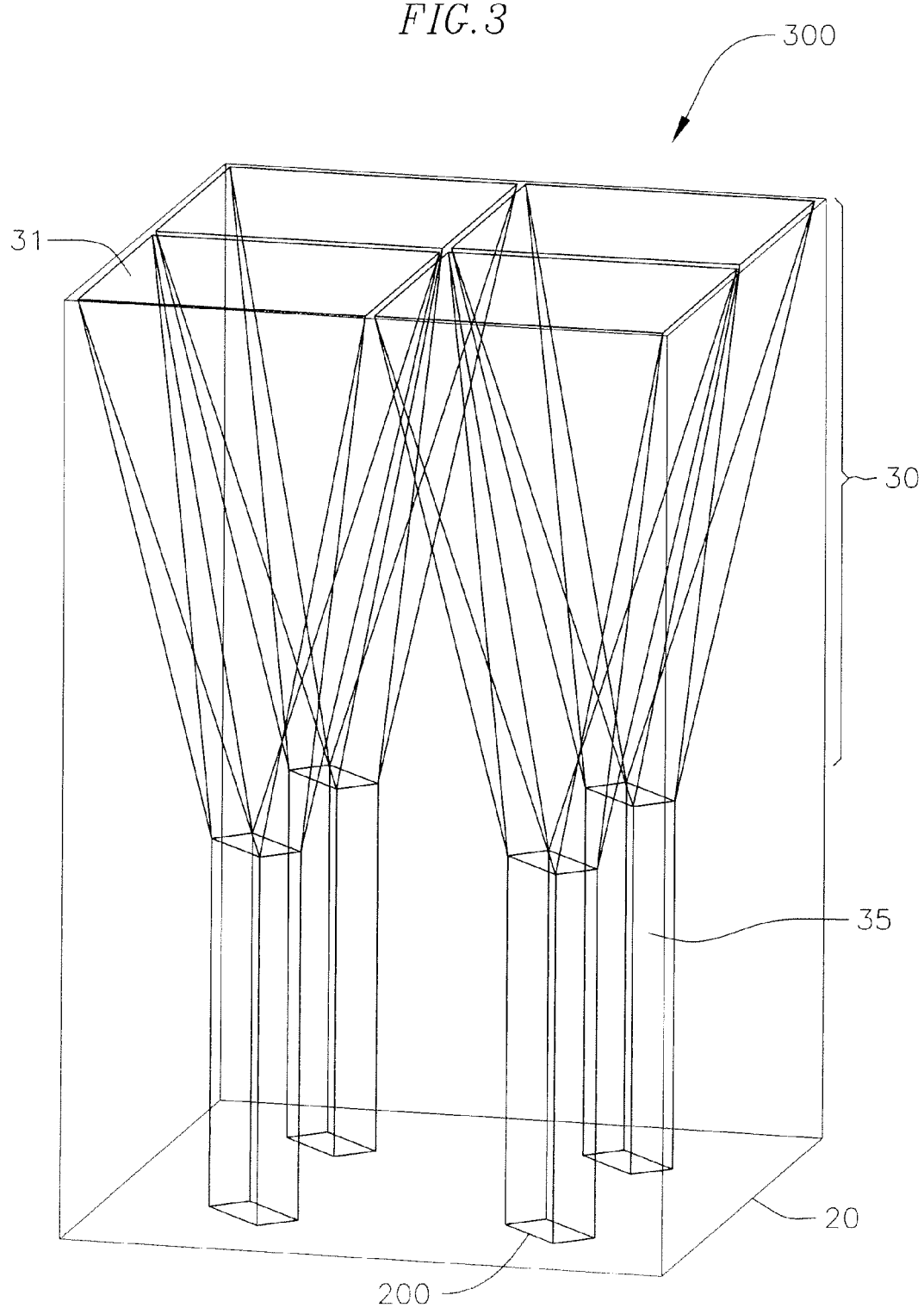
FIG. 3 shows a horn antenna array according to embodiments of the invention.

FIG. 3 shows a representative four-pixel horn antenna array 300. The focal plane array 20, as shown in FIG. 1, is coupled with an array 300 of individual horn antennas 30. Each horn antenna 30 may end in a rectangular waveguide 35 portion as needed which in turn could be coupled to a corresponding pixel 200.

The horn antennas 30 can be single or dual polarized with dual polarization providing an exemplary embodiment which raises imager sensitivity. In one exemplary embodiment, the dual polarization raises imager sensitivity by 1.5 dB. In another exemplary embodiment single polarization increases bandwidth and the imager 100 is more tolerant to misalignment of the horn antennas 30 during assembly. The assembly of the waveguide 35 and the pixel 200, that may be achieved by a silver epoxy, is tolerant to misalignment when either the waveguide 35 or the pixel 200 are translated diagonally.

The horn antennas 30 form a diagonal feed array because their inlet rectangular cross section 31 is rotated with respect to the rectangular cross section of the corresponding pixel 200. In an exemplary embodiment the horn antenna 30 may be approximately 0.32 inches on each side of its rectangular cross section 31 and 0.62 inches in height. With a pixel spacing of 0.32 inches and a Fresnel# of 1.44, the 3 dB beam width, that determines the resolution, is θ3 dB=0.3 degrees. The beam spacing is Δθ=1.1 degrees with the diameter of the lens D at 12 inches and the focal length F of the lens at 17.3 inches.

Figure 4:
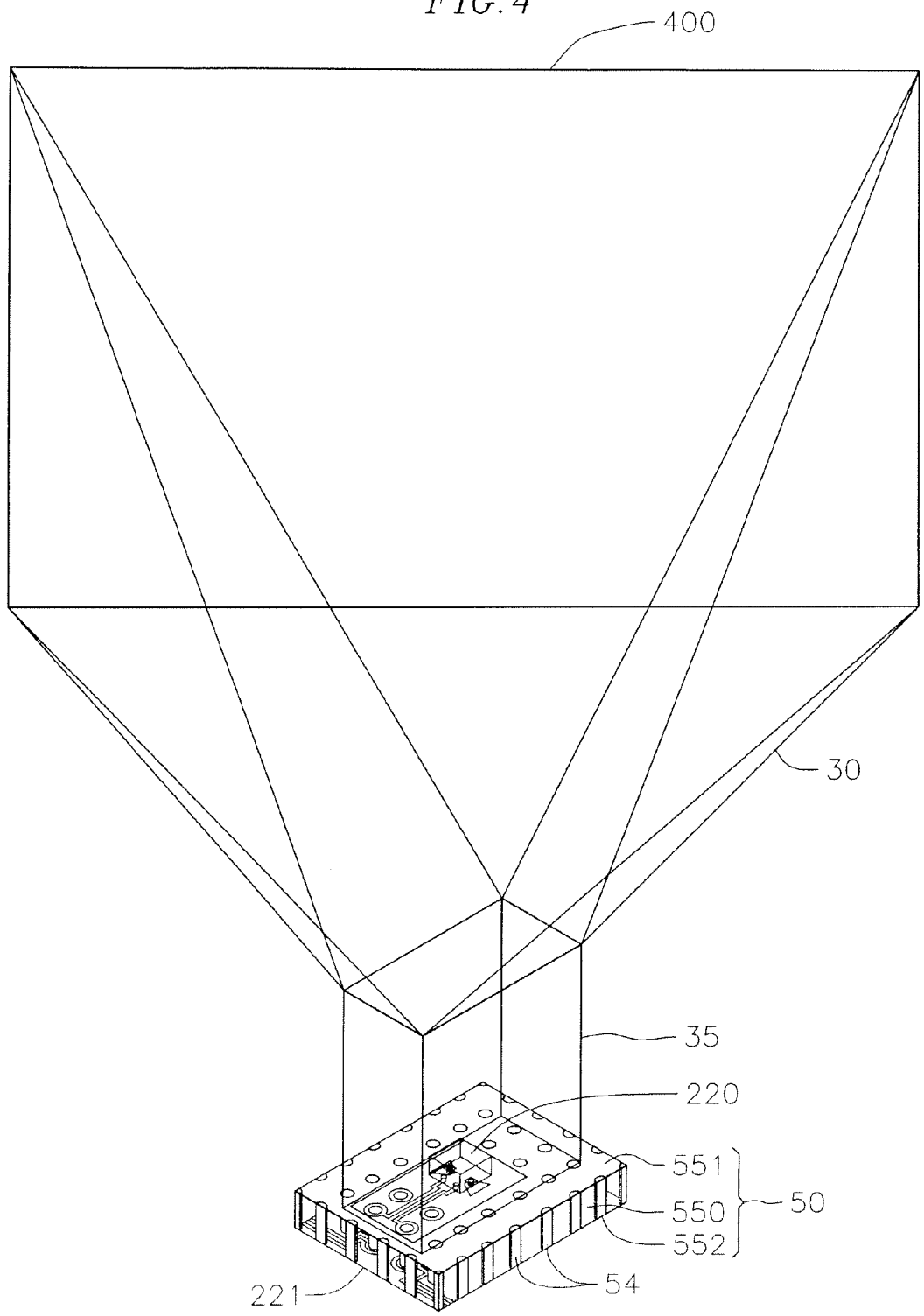
FIG. 4 shows a detector module according to embodiments of the invention.

FIG. 4 shows a representative detector module 400. The horn antenna array 300 may be molded or cast to form a single block that is electrically connected to an RF printed circuit board (PCB) 50. FIG. 4 schematically shows a representative waveguide 35 coupling a portion of the PCB 50 to a representative horn antenna 30. The PCB 50 has a corresponding detector (not shown) associated with the representative assembly of the waveguide 35 and the horn antenna. A set of detector modules 400 arranged in an array form the focal plane array 20 of FIG. 1. Transition from the waveguide 35 to the detector is a critical RF path that provides efficient power transfer over a wide bandwidth of frequencies and may be assembled at a low cost. The signal detected may be fed through to readout electronic circuitry. The PCB 50 includes a quartz substrate 550 that includes electrical connections 221 for readout circuitry (see FIG. 9) located on the bottom or back side 552 and monolithic microwave integrated circuit (MMIC) chips 220 mounted on the top or front side 551. The quartz substrate 550 includes vias 54 that are formed through the quartz substrate 550 wafer. The MMIC chips 220 may be assembled onto the PCB 50 using flip chip technology. In an alternative embodiment, the detector module may not include the waveguide 35 and the horn antenna 30 may be directly connected to the PCB 50.

Connection between the horn antennas 30 and the PCB 50 may be done directly, such as by bonding or through radiative coupling. Bonding can be accomplished by solder perform or silver epoxy. Radiative coupling can be achieved by maintaining the horn output openings at a fixed distance from detector coupling structures located on the PCB 50.

For the case of radiative coupling, steps are taken to ensure significant power does not radiate across the PCB 50. This may be accomplished by using periodic etch patterns on the horn antenna array 300 bottom surface or on the PCB 50 surface that prevent power from flowing. Corrugated surfaces, for example, reflect the wave being radiated and prevent free flow of energy out of the PCB 300.

In an exemplary embodiment, the quartz substrate 550 may be 0.5 mm in thickness with 0.15 mm filled vias 54. The vias 54 serve as electrical conduction paths between the two surfaces of the quartz substrate wafer 550 if and where required. The vias 54 also functions as antennas and contribute to the capability of the quartz substrate 550 itself to act as an antenna for oncoming wave energy.

Figure 5:
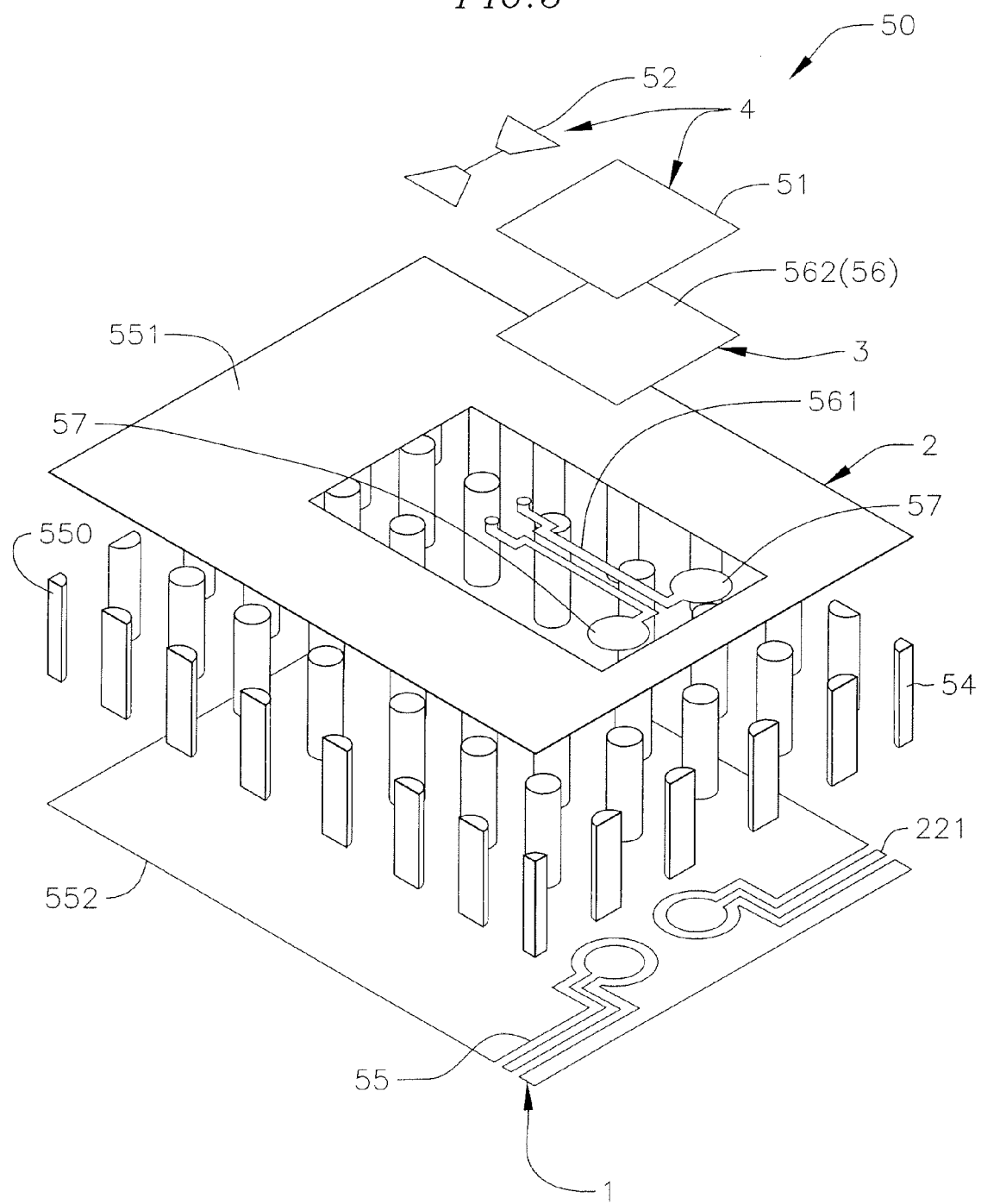
FIG. 5 shows an assembly process flow for a printed circuit board and an exploded view of the printed circuit board according to embodiments of the invention.

FIG. 5 shows an assembly process flow for the PCB 50 before a MMIC chip 220 has been assembled onto it. The various parts of the PCB 50 are shown in an exploded form. First (1) the back side 552 of the quartz substrate 550 is patterned and electroplated to include the electrical connections 221 for readout circuitry (see FIG. 9) including a DC lineout 55. Then (2), the front 551 or chip side metal is patterned and electroplated to form one plate 561 of an RF bypass capacitor 56 (see also FIGS. 6 and 7) for RF shielding and DC out regions 57.

Impedance matching is done on the front side 551, both on the MMIC chip 220 and on the PCB 50. The detected outputs are routed through vias 54 from the front side 551 to the back side 552 of the PCB 50, and from there to video amplification and other signal processing electronics. Except for the output vias 54, the vias 54 connect the front side ground plane 551 to the back side ground plane 552 of the PCB 50. The area directly beneath the MMIC chip 220 does not contain vias 54, thereby forming a back-short cavity.

Next (3), a dielectric layer 562 is deposited and patterned on the chip side. The material deposited in this step may be SiN. The on-chip RF bypass capacitor formed using the SiN layer 562, the capacitor plate 561, and another capacitor plate 563 (FIG. 6) provides the RF bypass capacitor 56 for DC outputs. An RF bypass capacitor is typically a parallel element that appears as a short to RF signals and serves to carry the RF energy to ground.

Last (4), a DC shield 51 and the E plane probes 52 are patterned and electroplated.

The fabrication process for the quartz substrate 550 provides the transition from the E plane probes 52 to where the BTD 225 would eventually be located (not shown). An exemplary quartz substrate 550 includes vias 54 of 2 μm height above the substrate 550 that are filled through by a mixture of W and Cu and are aligned with the DC out regions 57. The fabrication process accommodates multiple diode types including the BTD 225 that once assembled is used as the main detector of the incoming radiation.

Figure 6:
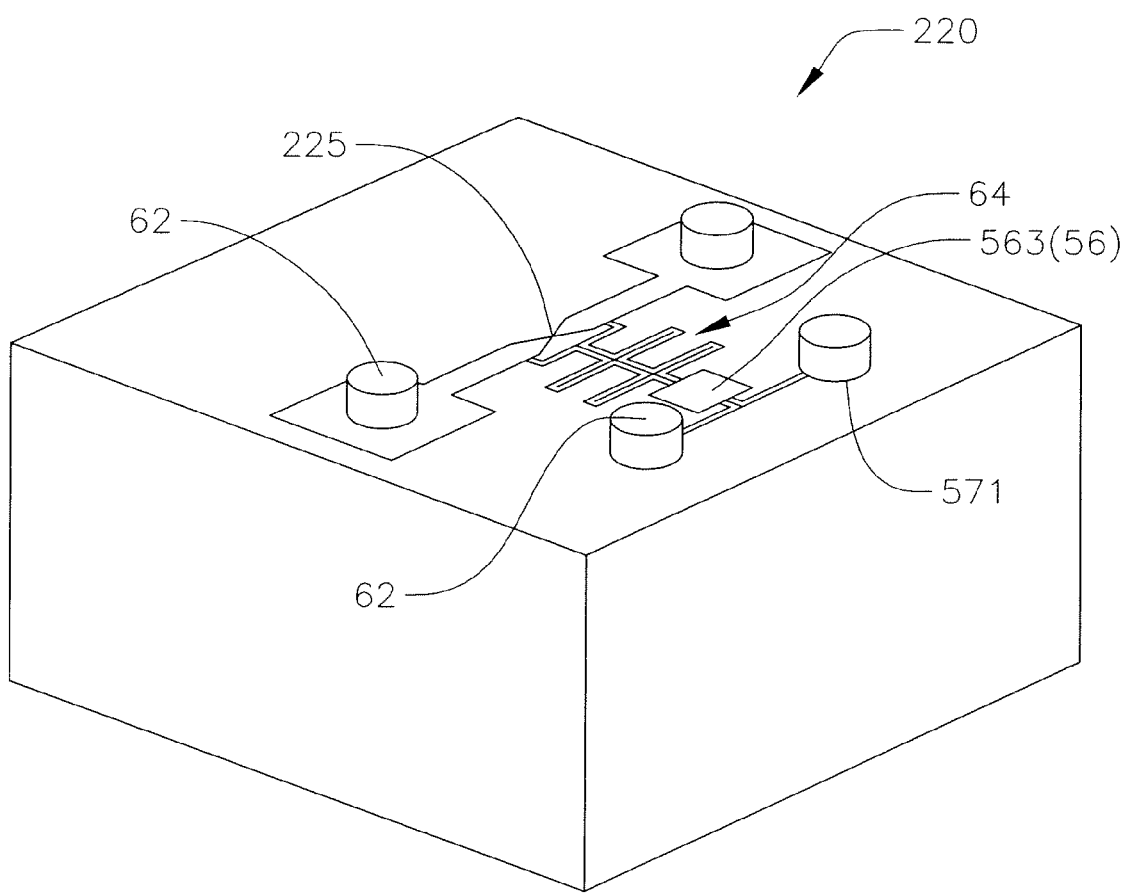
FIG. 6 shows the MMIC chip including a BTD detector in perspective view according to embodiments of the invention.

The "chipless" or passive RF performance of the E plane probes 52 and the quartz substrate 550 without the BTD 225 may be evaluated before complete assembly of the MMIC chips 220. The DC lineout 55 and the RF shielding performance may be also evaluated during fabrication FIG. 6 shows the MMIC chip 220 in perspective view. This MMIC chip 220 may be flipped upside down and flip chip bonded onto the PCB 50 shown in FIG. 5. In that case, Au stubs or bumps 62 may be electroplated on the top side of the MMIC chip 220. An exemplary Au bump 62 may be 20 μm-25 μm tall and 50 μm in diameter. The bonding of the MMIC chip 220 onto corresponding Au bumps on the surface of the quartz substrate 550 may be performed by Au—Au thermo-compression. The MMIC chip 220 includes the BTD 225 that detects the incoming wave energy and directs a corresponding signal through a meander line 64 to the RF bypass capacitor 56 having a plate 563 and to the DC out 571 of the MMIC chip 220. The meander line 64 gives a 90 degree phase shift to the RF bypass capacitor 56. This creates a high RF impedance at the diode terminals of the BTD 225, preventing the DC circuitry from interfering with the operation of the RF circuitry.

In an exemplary embodiment, the MMIC chip 220 may be a GaAs flip chip with 0.5×0.5×0.25 mm dimensions.

A diode may be modeled equivalently as a series resistor Rs coupled in series to a parallel connection of a junction capacitor Cj and a junction resistor Rj. Exemplary parameters for a 1.5 μm×1.5 μm BTD 225 include a junction resistance Rj of 500Ω, a junction capacitance Cj of 20 fF and a series resistance Rs of 13Ω. Exemplary parameters for a 1.0 μm×1.0 μm BTD 225 include a junction resistance Rj of 1300Ω, a junction capacitance Cj of 9 fF and a series resistance Rs of 28Ω. Exemplary parameters for a 0.8 μm×0.8 μm BTD 225 include a junction resistance Rj of 2500Ω, a junction capacitance Cj of 5 fF and a series resistance Rs of 40Ω.

Figure 7:
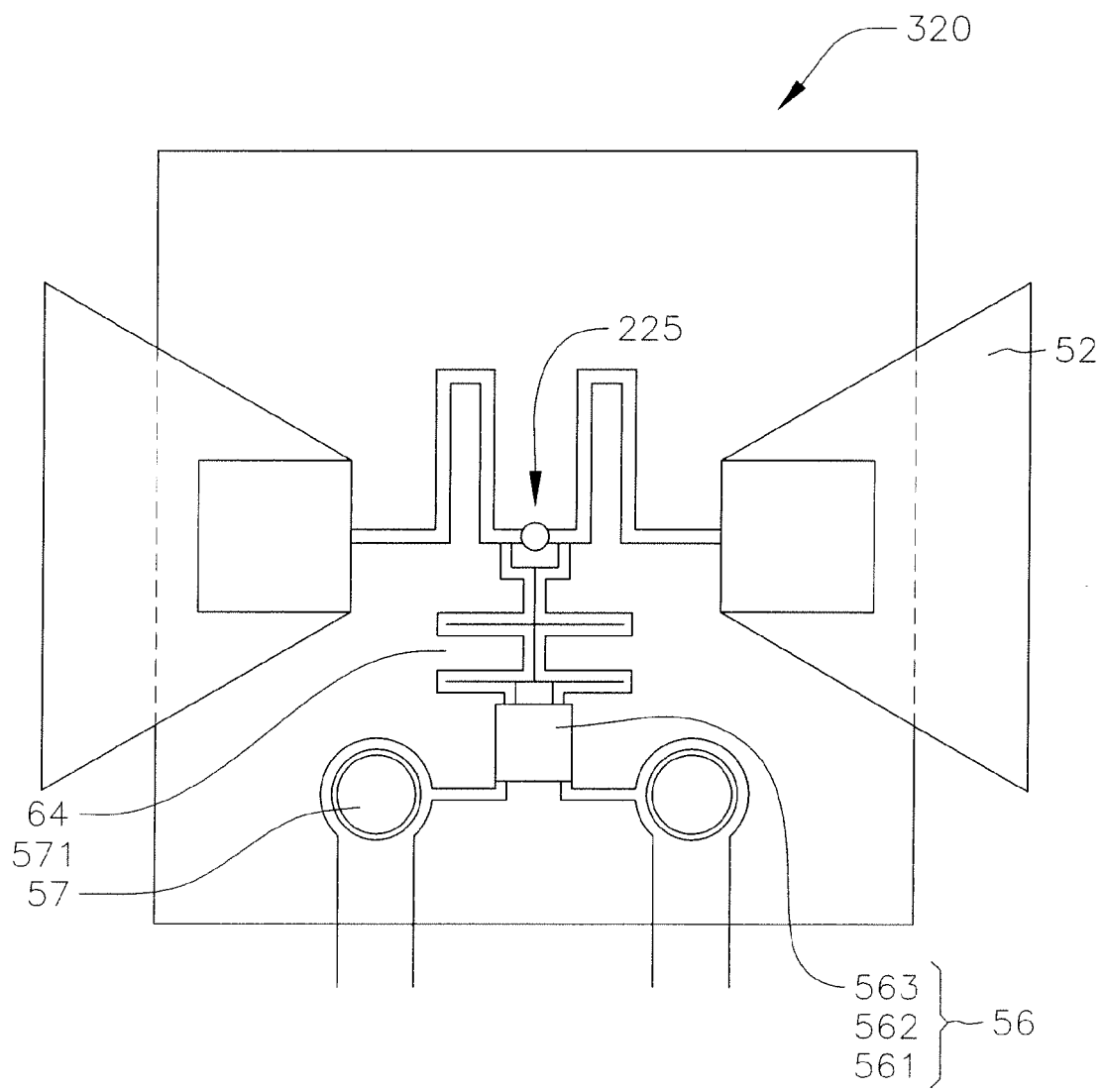
FIG. 7 shows the MMIC chip including the BTD detector and flip chip assembled onto the printed circuit board in plan view according to embodiments of the invention.
Figure 8:
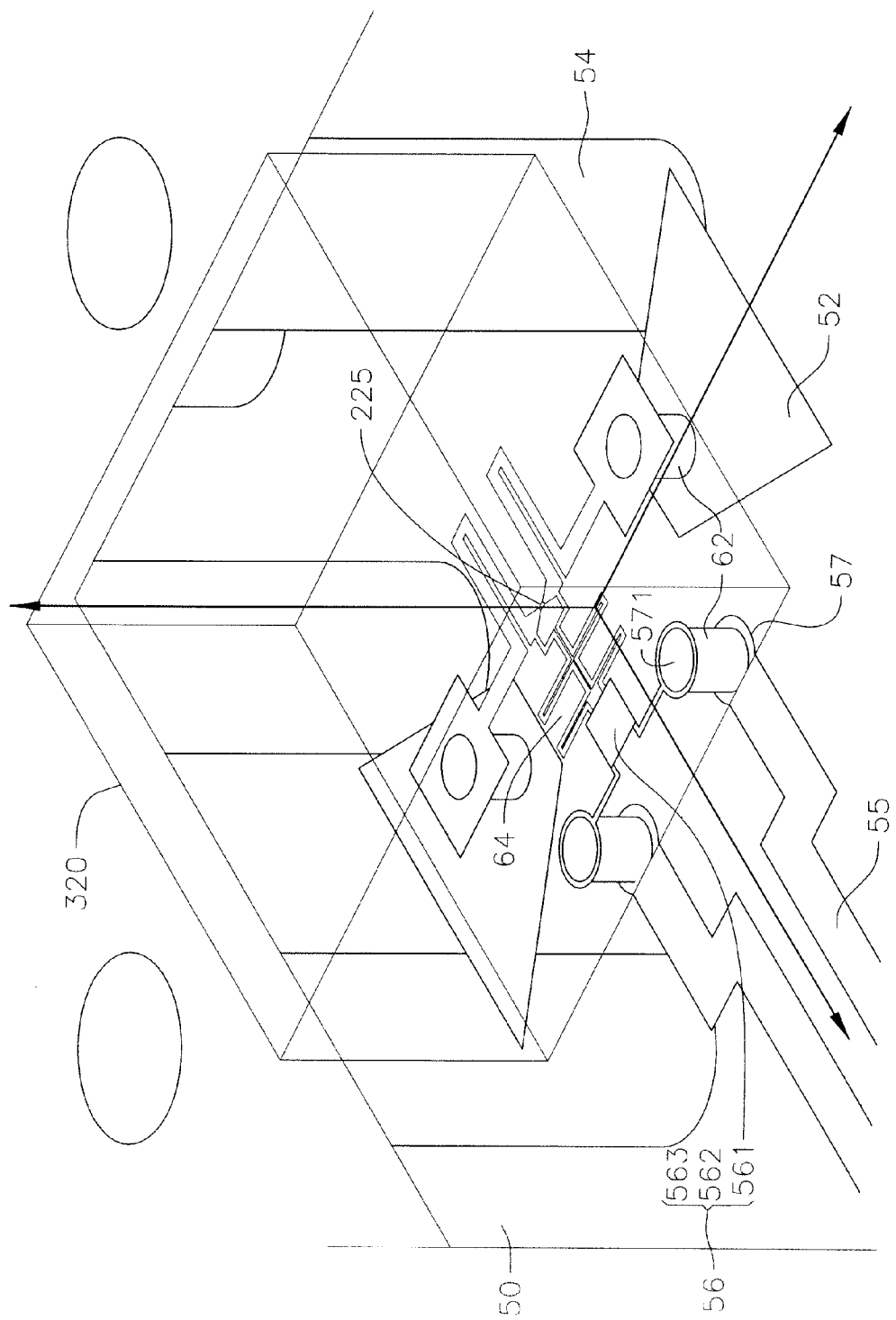
FIG. 8 shows the MMIC chip of FIG. 7 in perspective view.

FIG. 7 shows an alternative embodiment 320 of the MMIC chip 220 as assembled upon the PCB 50 in plan view. The BTD 225 is located between the two E plane probes 52 and is coupled to them via two portions of the circuit whose length L may be adjusted so that the effective inductance resonates with the junction capacitance of the BTD 225. These are therefore transformer couplers between the E plane probes 52 that are electroplated on the PCB 50 and the BTD 225 that is located on the MMIC chip 320. The energy detected by the BTD 225 is directed through the delay or the meander line 64 to the RF bypass capacitor 56 formed from 3 layers 561, 562, 563 and from there to the DC out regions 57, 571. The DC out regions 57, 571 carry the signal corresponding to the detected energy through the via 54 (FIGS. 4 and 5) to the DC lineout 55 on the back side of the PCB 50. FIG. 8 shows the MMIC chip of FIG. 7 in perspective view.

Figure 9:
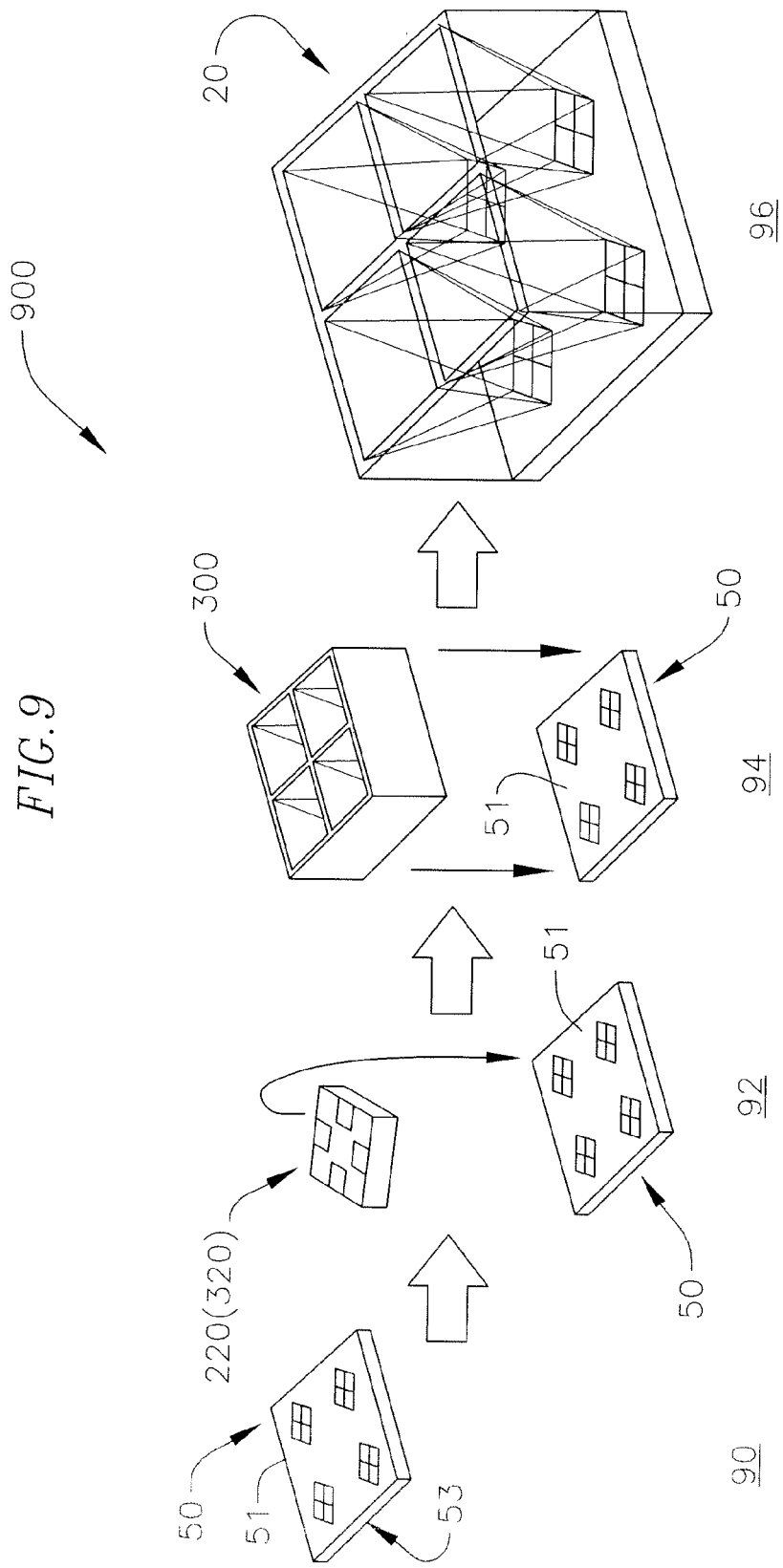
FIG. 9 shows a low-cost assembly process for the focal plane array according to embodiments of this invention.

FIG. 9 shows a low-cost assembly process 900 for the focal plane array 20. First, the multi-layer PCB 50 is fabricated (90) with a metal pattern on the top or front side 51 that includes bonding pads for the BTD 225 and bonding pads for the horn antenna array 300. Other embodiments are possible that do not require direct bonding of the horn antenna array 300 to the PCB 50. The other side, could be called the bottom side, the output side, or the back side 53, of the PCB 50. The back side 53 has bonding pads and signal lines for routing the detected signal to electronic parts located behind the PCB 50 and that are used to read the detected signal and relay it to the signal processor. In one embodiment, the substrate of the PCB 50 may be about a quarter wavelength electrically.

Next, the MMIC chip 220 (or 320) is flip-chip bonded (92) to the front side 51 of the PCB 50. Flip chip microelectronic assembly is the direct electrical connection of face-down (hence, "flipped") electronic components onto substrates, circuit boards, or carriers, by means of conductive bumps on the chip bond pads. In contrast, wire bonding uses face-up chips with a wire connection to each pad. Flip chip components are predominantly semiconductor devices; however, components such as passive filters, detector arrays, and MEMs devices are also used in flip chip form. Flip chip is also called Direct Chip Attach because the chip is directly attached to the substrate, board, or carrier by the conductive bumps.

Flip chip has advantages in size, performance, flexibility, reliability, and cost over other packaging methods. Eliminating packages and bond wires reduces the required board area, and requires far less height and weight. Eliminating bond wires reduces the parasitic inductance and capacitance of the connection. The result is high speed off-chip interconnections. Flip chip gives input/output connection flexibility. Wire bond connections are limited to the perimeter of the die. Flip chip connections can use the whole area of the die, accommodating many more connections on a smaller die. Area connections also allow 3-D stacking of die and other components. Flip chip is mechanically a rugged interconnection method because flip chips, when completed with an adhesive "underfill," are solid little blocks of cured epoxy.

Next, the horn antenna array 300 is attached (94) to the front side 51 of the PCBs 50 over the array of BTDs 225 that are included within the MMIC chips 220 (or 320). The size of the horn antenna array 300 will be determined by the tolerances required by the focal plane array 20 and the tolerances available from the manufacturing process of the horn antenna array 300. Larger arrays can be fabricated by allowing for these tolerances and by assembling multiple horn antenna arrays 300 across the PCB 50. The final assembled focal plane array 20 is shown in the last step (96). In the embodiment shown in FIG. 9, the horn antenna array 300 includes horn antennas with inlets having rectangular cross-sections. The rectangular cross-sections of the inlets of the horn antennas in the horn antenna array 300 are shown to be parallel to the PCB (50). Similarly, in the four-pixel horn antenna array 300 of FIG. 3, the inlet rectangular cross-section 31 is shown to be parallel to focal plane array 20 and to the rectangular cross-section of the corresponding pixels 200 in the focal plane array 20.

Figure 10:
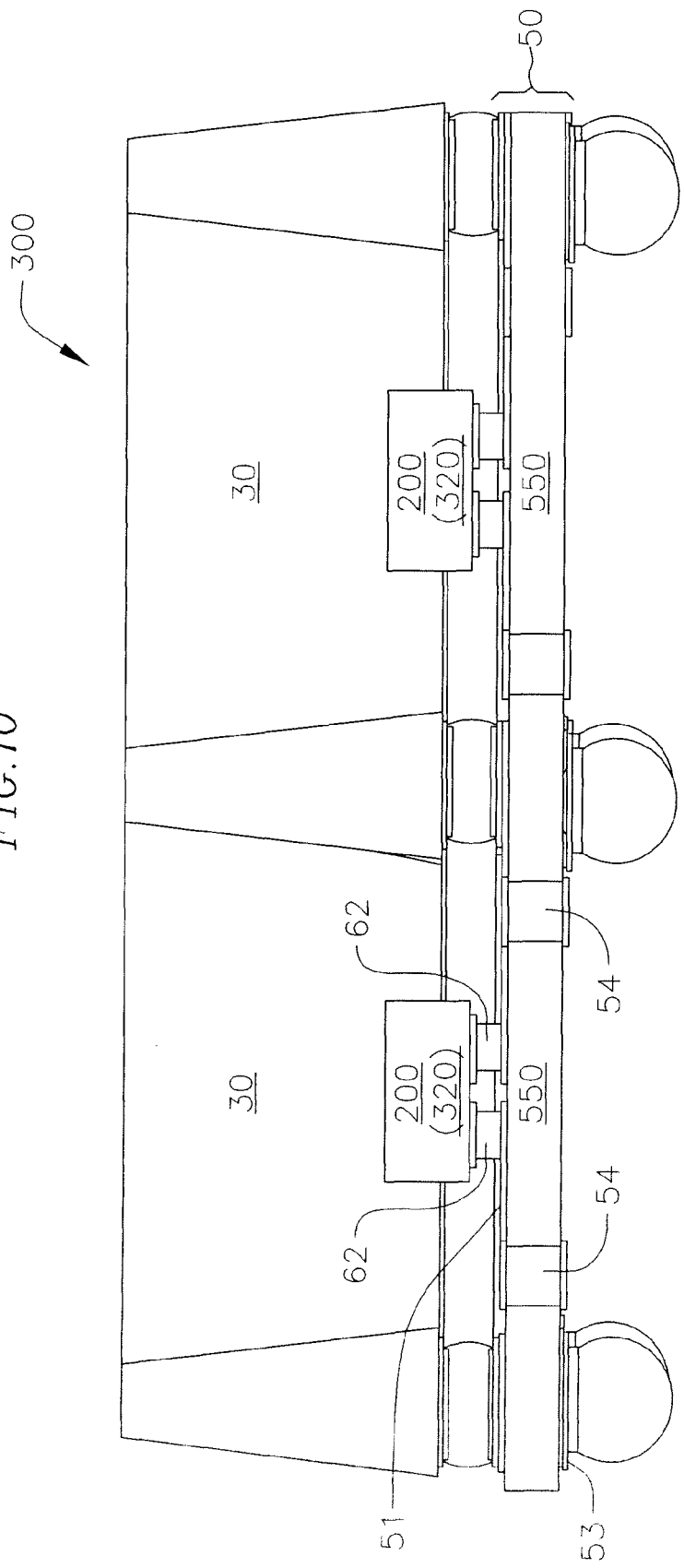
FIG. 10 shows the focal plane array in cross-sectional view according to embodiments of this invention.

FIG. 10 shows an antenna array 300 assembly over a PCB 50 in cross sectional view. The quartz substrate 550 wafer is bonded to the horn antenna 30 structure using silver epoxy or solder. Each MMIC chip 220 (or 320) is flip chip bonded over the quartz substrate and is within the throat of the respective horn antenna 30. Bumps or stubs 62 of the PCB 50 onto which the MMIC chip 220 (or 320) is bonded form orthogonal pick-up probe antennas for each horn antenna 30 for the reception of a single polarization. The detected output signals from the BTD 225 travel along a delay line to the RF bypass capacitor 56 and then through bumps 62 to the PCB 50. These signals run across the PCB 50, underneath the upper ground plane 563 that is insulated by the SiN dielectric layer 562, to the vias 54 that transfer the signals to the back side 53 of the PCB 50. From the back side 53 of the PCB 50, solder balls may be used to facilitate connection of the signals to subsequent amplification and signal processing.

Ball Grid Array (BGA) 91 may be used as part of the connection to subsequent amplification electronics. A BGA is a popular surface mount chip package that uses a grid of solder balls as its connectors. Available in plastic and ceramic varieties, BGA is noted for its compact size, high lead count and low inductance. BGA chips are easier to align to the PCB 50, because the leads, which are called "solder balls" or "solder bumps," are farther apart than leaded packages. Because the leads are underneath the chip, BGA has led the way to chip scale packaging (CSP) where the package is not more than 1.2 times the size of the semiconductor die itself.

In an alternative embodiment, a dual polarized scheme as opposed to a single polarized scheme may be used. Each pixel would require a single BTD detector for a singly polarized imager and two BTD detectors for a dual polarized imager. To fit both BTD detectors without shorting them out, a bridge of metal may be used so that one circuit trace may run over another without contacting it. The MMIC chips can contain circuitry in addition to the BTDs that provides interconnection and impedance matching. As stated above, the MMIC chips can be mounted to a PCB using a variety of methods, such as flip chip or die attach and the circuitry on the PCB electrically connects, directly or radiatively, the BTD detectors to the horn antenna inputs. The outputs may be connected to low frequency circuitry for signal conditioning, such as low noise amplifiers and Dicke switches that are used as a calibrated noise source at lower frequencies. This can be conveniently accomplished by feeding the detected signals through the PCB to the opposite side using for example plated through holes, or vias, and connecting to the low frequency electronics that is located on the bottom side of the PCB. In this way the assembly becomes a fully integrated focal plane array.

In one embodiment, the PCB may have readout electronics on the bottom or back side and flip chip MMIC chips on the top or front side where the BTDs are located. The entire assembly may behave like an antenna. A horn antenna may be placed over the assembly of the BTD on the flip chip MMIC and on the PCB. Radiation enters the horn antenna and reaches the flip chip MMIC which is also an antenna and detects the radiation. Flip chips have bumps on the back side and the bumps have catch pads on them. The flip chip metal tapers down to a spot where the BTD is located. Interconnect lines go from bump to bump and the DC output is conducted off the flip chips. The back side of the PCB and the interconnects all behave as a collective antenna.

In one embodiment, a modular array concept is used. In this embodiment, the PCB substrate including the flip chip and the horn antennas that are silver epoxied onto the substrate, solder bumps on the back of the PCB connect the module to other circuitry. As a result, the assembly of the PCB, the flip chip MMIC and the horn antennas becomes a module, like module shown in FIG. 4, that can be interconnected with other modules.

In one embodiment the PCB surface or the horn antenna bottom surface may be corrugated in order to prevent the wave from propagating through and to make it reflect back.

As a result of the unique properties of the BTD detector, full two dimensional focal arrays can be fabricated and integrated with antenna arrays without the need for RF LNAs, unlocking the commercial and military potential of millimeter wave imaging. The BTD is easy to manufacture with high yields, is relatively temperature independent, exhibits low added noise, and has high responsivity.

One aspect of this invention presents the use of BTD detectors in conjunction with a low cost array of antennas. BTD detectors do not require a DC bias current to operate, so the added noise level is very low, and the BTD is only limited by thermal noise generated within the diodes. Because the diode noise is low, RF LNAs can be eliminated from the circuit, or they can be included only to further increase the sensitivity. Because of the low noise level, calibrated noise source Dicke switches do not need to be implemented at RF frequencies, but can be instead implemented at low frequencies following detection. The elimination of these RF integrated circuits significantly reduces the imager cost. This cost reduction is a direct result of the unique characteristics of the BTD detectors. In addition, the RF LNA is often itself a large source of noise due to drift and heat resulting from the bias current. Therefore, eliminating the RF LNA improves performance and simplifies calibration. A low cost array of antennas, such as the horn antennas shown in the drawings, efficiently collects RF energy and delivers that energy to the BTD detectors with minimal losses. Using the antenna array also helps reduce added noise and results in a low cost, integrated focal plane array for room temperature millimeter wave imaging.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. An RF printed circuit board comprising:
   a substrate having a thickness of one quarter wavelength of a millimeter wave;
   a first metal pattern on a first side of the substrate, the first metal pattern comprising bonding pads;
   a second metal pattern comprising electrical connections for readout electronics on a second side of the substrate, the second side facing oppositely away from the first side;
   a plurality of vias through the substrate for routing a signal from the first side to the electrical connections for readout electronics located on the second side; and
   a flip chip comprising backward tunneling diode detectors, the flip chip bonded to the bonding pads on the first side of the substrate.

2. The RF printed circuit board of claim 1, further comprising:
   a two-dimensional array of horn antennas electrically coupled to the substrate.

3. The RF printed circuit board of claim 2, wherein the two-dimensional array of horn antennas is a single block.

4. The RF printed circuit board of claim 2, wherein the electrical coupling between the two-dimensional array of horn antennas and the RF printed circuit board is either by direct bonding or through radiative coupling.

5. The RF printed circuit board of claim 1, further comprising:

a plurality of readout electronics located on the second side of the substrate.

6. An RF printed circuit board comprising:
a substrate having a thickness of one quarter wavelength of a millimeter wave;
a first metal pattern on a first side of the substrate, the metal pattern comprising bonding pads;
a second metal pattern comprising electrical connections for readout electronics on a second side of the substrate, the second side facing oppositely away from the first side;
a plurality of vias through the substrate for routing a signal from the first side to the electrical connections for readout electronics located on the second side;
a flip chip comprising backward tunneling diode detectors, the flip chip bonded to the bonding pads on the first side of the substrate;
a two-dimensional array of horn antennas electrically coupled to the substrate; and
a plurality of readout electronics located on the second side of the substrate,
wherein the two-dimensional array of horn antennas is a single block, and
wherein the electrical coupling between the two-dimensional array of horn antennas and the RF printed circuit board is either by direct bonding or through radiative coupling.

7. A printed circuit board for detecting RF wave energy comprising:
means for detecting wave energy on a first side of the printed circuit board;
means for receiving and directing the wave energy radiatively toward the means for detecting wave energy without an intervening active component; and
means for providing the detected wave energy to readout circuitry on a second side of the printed circuit board, the second side facing oppositely away from the first side.

8. The printed circuit board for detecting RF wave energy of claim 7, wherein the means for detecting wave energy comprises an array of backward tunneling diodes.

9. The printed circuit board for detecting RF wave energy of claim 7, wherein the printed circuit board comprises:
a quartz substrate having a thickness of one quarter wavelength of a millimeter wave; and
a metal pattern on a side of the quartz substrate corresponding to the first side of the printed circuit board, the metal pattern comprising bonding pads for coupling the means for detecting the wave energy to the first side of the printed circuit board.

10. The printed circuit board for detecting RF wave energy of claim 9, wherein the means for providing the detected wave energy to readout circuitry comprises a plurality of vias through the quartz substrate for routing a signal from the first side to electrical connections located on the second side of the printed circuit board.

11. The printed circuit board for detecting RF wave energy of claim 7, wherein the means for receiving and directing wave energy comprises a horn antenna having an inlet and a throat, the inlet having a rectangular cross-section.

12. The printed circuit board for detecting RF wave energy of claim 11, wherein the throat comprises a waveguide portion between the inlet and the printed circuit board.

13. The printed circuit board for detecting RF wave energy of claim 11, wherein the means for detecting wave energy is positioned on the printed circuit board to be substantially in a line of sight of a center of the inlet of the horn antenna.

* * * * *